(12) United States Patent
Yamamoto

(10) Patent No.: US 9,274,185 B2
(45) Date of Patent: Mar. 1, 2016

(54) METHOD FOR JUDGING COERCIVE FORCE OF MAGNETIC RECORDING MEDIUM

(75) Inventor: Hisashi Yamamoto, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 317 days.

(21) Appl. No.: 13/819,076

(22) PCT Filed: Mar. 29, 2012

(86) PCT No.: PCT/JP2012/058326
§ 371 (c)(1),
(2), (4) Date: Feb. 26, 2013

(87) PCT Pub. No.: WO2012/160871
PCT Pub. Date: Nov. 29, 2012

(65) Prior Publication Data
US 2013/0154628 A1    Jun. 20, 2013

(30) Foreign Application Priority Data

May 24, 2011    (JP) .................................. 2011-115821

(51) Int. Cl.
| | |
|---|---|
| G01R 33/12 | (2006.01) |
| G11B 5/008 | (2006.01) |
| G11B 5/09 | (2006.01) |
| G01R 33/00 | (2006.01) |
| G06K 1/12 | (2006.01) |
| G06K 7/08 | (2006.01) |

(52) U.S. Cl.
CPC ........ *G01R 33/1207* (2013.01); *G01R 33/0064* (2013.01); *G06K 1/125* (2013.01); *G06K 7/084* (2013.01); *G11B 5/00808* (2013.01); *G11B 5/09* (2013.01)

(58) Field of Classification Search
None
See application file for complete search history.

(56) References Cited

U.S. PATENT DOCUMENTS

| | | | | |
|---|---|---|---|---|
| 5,317,549 | A | * | 5/1994 | Maeda et al. ............... 369/53.24 |
| 8,767,331 | B2 | * | 7/2014 | Wagner et al. .................. 360/57 |

FOREIGN PATENT DOCUMENTS

| | | |
|---|---|---|
| JP | 3-229391 | 10/1991 |
| JP | 10-255211 | 9/1998 |
| JP | 11-283201 | 10/1999 |

(Continued)

OTHER PUBLICATIONS

International Search Report for PCT/JP2012/058326 dated May 22, 2012.

*Primary Examiner* — Daniell L Negron
(74) *Attorney, Agent, or Firm* — Frommer Lawrence & Haug LLP

(57) ABSTRACT

A method for judging a coercive force of a magnetic recording medium, so recording magnetic information can be formed in either a low coercivity magnetic medium or a high coercivity magnetic medium by using a magnetic head. A magnetic information recording step writes magnetic information in the magnetic recording medium by alternately using a first write current suitable for writing in the low coercivity magnetic medium and a second write current suitable for writing in the high coercivity magnetic medium. A magnetic information reproducing step reproduces the magnetic information written in the magnetic recording medium. A judging step makes a judgment on a coercive force of the magnetic recording medium by way of comparing a first reproduced output A of the magnetic information written with the first write current and a second reproduced output B of the magnetic information written with the second write current.

8 Claims, 7 Drawing Sheets

(56) References Cited

FOREIGN PATENT DOCUMENTS

| JP | 11-328604 | 11/1999 |
| JP | 11328604 A * | 11/1999 |
| JP | 2000-155816 | 6/2000 |
| JP | 2004-296058 | 10/2004 |

* cited by examiner

METHOD FOR JUDGING COERCIVE FORCE OF MAGNETIC RECORDING MEDIUM

The present application claims priority from PCT patent application No. PCT/JP2012/058326 filed on Mar. 29, 2012, which claims priority from Japanese Patent Application No. JP 2011-115821, filed on May 24, 2011, the disclosures of which are incorporated herein by reference in their entirety.

FIELD OF THE INVENTION

The present invention relates to a method for judging a coercive force of a magnetic recording medium, and relates to a method for judging coercive forces of magnetic recording media, being suitable for a medium processing device such as a magnetic card reader provided with a function for judging different coercive forces of magnetic recording media.

It is noted that citation or identification of any document in this application is not an admission that such document is available as prior art to the present invention.

Generally, in a medium processing device, a magnetic head contacts a magnetic record area, such as a magnetic stripe, provided in a magnetic recording medium such as a magnetic card, a bank book, and the like, in order to write and read magnetic information recorded in the magnetic record area (recording and reproducing) by way of relatively moving the magnetic head. During recent years, for such a medium processing device for magnetic recording media, standardized are magnetic recording media, such as a magnetic card (hereinafter, called a "magnetic card"), including those with different coercive forces in their magnetic record area, such as a magnetic stripe and the like. For example, in addition to a magnetic card in which a magnetic record area has a conventionally-standardized low coercive force (for example, 300 to 400 Oe) (hereinafter, such a magnetic card being called a "low coercivity magnetic card"), a magnetic card in which a magnetic record area has a high coercive force (for example, 2,750 Oe) (hereinafter, such a magnetic card being called a "high coercivity magnetic card") is newly standardized. Specifically, in a high coercivity magnetic card, a magnetic record area is formed of a magnetic material in which magnetic information magnetized there is vanished only by applying a higher reverse-magnetic field (generally, 2,750 Oe or higher). Meanwhile, in a low coercivity magnetic card, a magnetic record area is formed of a magnetic material in which magnetic information magnetized there is vanished simply by applying a relatively-low reverse-magnetic field (generally, 650 Oe or lower), in recent years, for the purpose of reliability improvement and the like for magnetic information recorded in a magnetic card, or from a viewpoint of protecting the magnetic information recorded in a magnetic record area of the magnetic card, high coercivity magnetic cards are popularly and increasingly used. In the meantime, low coercivity magnetic cards are also popular in widespread use. As a result, high coercivity magnetic cards and low coercivity magnetic cards are used, being mixed.

Generally, in order for writing into magnetic cards that have different coercive forces in a range from low coercivity to high coercivity, it is impossible to attain an appropriate output without setting up an appropriate write current in accordance with a coercive force. Accordingly, for setting up the appropriate write current in accordance with the coercive force of a magnetic card, it is necessary to make a judgment on whether the magnetic card is a high coercivity magnetic medium or low coercivity magnetic medium. A method for judging a coercive force to make a judgment on the coercivity is a judging method on a coercive force of a magnetic card, in which a magnetic head reproduces or records magnetic information formed in a low coercivity magnetic card or a high coercivity magnetic card, for example, introduced through a card insertion slot. Then, after magnetic information of the inserted magnetic card is erased by using a current that can erase only magnetic information of a low coercivity magnetic card, the magnetic information of the magnetic card is reproduced. Under the situation described above, if the magnetic information is in a state of destruction, it is judged that the inserted magnetic card is a low coercivity magnetic card. Known is a method for judging a coercive force, in which it is judged that magnetic information, is in a state of destruction if predetermined certain magnetic information, which should be recorded in a magnetic card, cannot be recognized (for example, refer to Japanese Unexamined Patent Application Publication No. 2000-155816 ("JP 2000-155816")).

It is noted that in this disclosure and particularly in the claims and/or paragraphs, terms such as "comprises", "comprised", "comprising" and the like can have the meaning attributed to it in US. Patent law; e.g., they can mean "includes", "included", "including", and the like; and that terms such as "consisting essentially of" and "consists essentially of" have the meaning ascribed to them in U.S. Patent law e.g., they allow for elements not explicitly recited, but exclude elements that are found in the prior art or that affect a basic or novel characteristic of the invention.

It is further noted that the invention does not intend to encompass within the scope of the invention airy previously disclosed product, process of making the product or method of using the product, which meets the written description and enablement requirements of the USPTO (35 U.S.C. 112, first paragraph) or the EPO (Article 83 of the EPC), such that applicant(s) reserve the right to disclaim, and hereby disclose a disclaimer of, any previously described product, method of making the product, or process of using the product.

SUMMARY OF THE INVENTION

Unfavorably, in the method for judging a coercive force described in EP 2000-155816, it is judged whether or not the magnetic information is destructed, by means of counting the number of remaining output peaks greater than a certain output value. Therefore, a judgment result is dependent on the output level for judgment and the number of remaining output peaks. As a result, unfortunately the setup condition on the output level for judgment and a threshold value for the number of remaining output peaks makes a great effect on the judgment result.

Furthermore, since the judgment result on a coercive force is dependent on saturation characteristics and reproduced output of a magnetic head, unfortunately the judgment result is likely to be affected by uncertainties of the saturation characteristics and reproduced output.

Moreover, in the method for judging a coercive force described in JP 2000-155816, the judgment result is dependent on a write current value of writing magnetic information for high coercivity, and a current value of erasing magnetic information for low coercivity. Therefore, unfavorably the setup condition and variation of these current values make an effect on the judgment result.

In recent years, among low coercivity magnetic cards, those having a relatively high coercive force (for example, 650 Oe) also emerge to be used, being mixed. Accordingly, the setup condition of the current value for low coercivity makes a great effect on the judgment result.

Furthermore, unfavorably a reproduced output after DC-erasing with a current of a value for low coercivity is likely to fluctuate in accordance with characteristics of a magnetic head, a write current value, spacing between a magnetic card and the magnetic head, characteristics of the magnetic card, and so on. For example, in the case of a warped card being inserted, dust and the like adhering to a magnetic stripe, and so forth, a space between the magnetic stripe and a magnetic head becomes wider than usual. Then, unfortunately a change of magnetic flux becomes unusual so that a judgment on a coercive force of the magnetic card is made incorrectly.

Then, it is an object of the present invention to provide a method for judging a coercive force of a magnetic recording medium, the method enabling a judgment on the coercive force of the magnetic recording medium, with less chance of being affected by characteristics of a magnetic head and the magnetic recording medium as well as variation of a write current value.

To achieve the object described above, the present invention provides the following aspects.

(1) A method for judging a coercive force of a magnetic recording medium, in order for recording magnetic information to be formed in either a low coercivity magnetic medium or a high coercivity magnetic medium by using a magnetic head, the method including: a magnetic information recording step for writing magnetic information in the magnetic recording medium by alternately using a first write current suitable for writing in the low coercivity magnetic medium and a second write current suitable for writing in the high coercivity magnetic medium; a magnetic information reproducing step for reproducing the magnetic information written in the magnetic recording medium; and a judging step for making a judgment on a coercive force of the magnetic recording medium by way of comparing a first reproduced output of the magnetic information written with the first write current and a second reproduced output of the magnetic information written with the second write current.

According to the present invention, by way of comparing the first reproduced output of the magnetic information written with the first write current suitable for writing in a low coercivity magnetic medium and the second reproduced output of the magnetic information written with the second write current suitable for writing in a high coercivity magnetic medium, it is possible to make a judgment on whether the magnetic recording medium is a low coercivity magnetic medium or a high coercivity magnetic medium, on the basis of a difference in the reproduced output values.

Therefore, in the method for judging a coercive force of a magnetic recording medium according to the present embodiment, a judgment result is unlikely to be affected by variation of the reproduced output of the magnetic head, so that a judgment result with high reliability can be obtained.

(2) The method for judging a coercive force of a magnetic recording medium; wherein the judging step judges that the magnetic recording medium is a low coercivity magnetic medium if the first reproduced output is greater than die second reproduced output, and otherwise judges that the magnetic recording medium is a high coercivity magnetic medium.

According to the present invention, a low coercivity magnetic medium, which can easily be recognized, is judged to be a low coercivity magnetic medium if the first reproduced output is greater than the second reproduced output; and thus a magnetic medium can still be recognized to be a high coercivity magnetic medium even though it is impossible to make a judgment on the difference in the reproduced output values of magnetic information; and therefore, a judgment result can be obtained for sure.

(3) The method for judging a coercive force of a magnetic recording medium; wherein provided is a checking step for checking a presence of magnetic information by way of reproducing magnetic information written in the magnetic recording medium before the magnetic information recording step.

According to the present invention, it is possible to make sure in advance whether or not magnetic information is written in the magnetic recording medium, so that operation can proceed to an appropriate step, according to the presence status of magnetic information. For example operation can directly proceed to the magnetic information recording step if no magnetic information is written in the magnetic recording medium.

(4) The method for judging a coercive force of a magnetic recording medium; wherein provided is an erasing step for erasing magnetic information with an erasing current of a value, with which magnetic information of the high coercivity magnetic medium can be erased, in the case where magnetic information is written in the magnetic recording medium at the checking step.

According to the present invention, in the case where magnetic information is written in the magnetic recording medium, the magnetic information is erased with an erasing current of a value, with which magnetic information of a high coercivity magnetic medium can be erased. Therefore, a judgment on a coercive force can be made on the basis of a difference in the reproduced output values of magnetic information written at the magnetic information recording step, so that it is possible to eliminate influence that the magnetic information already written in the magnetic recording medium has on a judgment result.

(5) The method for judging a coercive force of a magnetic recording medium; wherein the judging step judges that the magnetic recording medium is a low coercivity magnetic medium if the first reproduced output is greater than the second reproduced output, and the magnetic recording medium is a high coercivity magnetic medium if the first reproduced output is less than the second reproduced output.

According to the present invention, on the basis of the saturation characteristics of the magnetic recording medium, it is possible to recognize the magnetic recording medium to be a low coercivity magnetic medium if the first reproduced output is greater than the second reproduced output, and to recognize the magnetic recording medium to be a high coercivity magnetic medium if the first reproduced output is less than the second reproduced output. As a result, it is possible to definitely judge on whether the magnetic recording medium is a low coercivity magnetic medium or a high coercivity magnetic medium.

(6) The method for judging a coercive force of a magnetic recording medium; wherein at the magnetic information recording step, a magnetic record area, where magnetic information of the magnetic recording medium is recorded, is segmented in its longitudinal direction, and magnetic information is written in the magnetic record area, with respect to each of the segmented comparison zones, by alternately using the first write current and the second write current.

According to the present invention, the magnetic record area is formed into, for example, two to ten segmented comparison zones. Then, with respect to each of the comparison zones being segmented, magnetic information is written in the magnetic record area, by alternately using the first write current and the second write current. Thus, it is possible to suppress variation of the reproduced output owing to deformation of the magnetic recording medium, variation of magnetic characteristics, and variation with respect to a space between the magnetic recording medium and the magnetic head; and it is possible to obtain a judgment result with higher reliability.

In the method for judging a coercive force according to the present invention, for example, average values of reproduced output of magnetic information written in a plurality of comparison zones with the same write current are individually calculated. Then, by making comparison on the average values of reproduced output, variation of the reproduced output is suppressed so that a judgment result with high reliability can be obtained.

(7) The method for judging a coercive force of a magnetic recording medium; wherein at the judging step, either a difference or a ratio of the first reproduced output and the second reproduced output is calculated, in order to obtain the coercive force of the magnetic recording medium.

According to the present invention, a value of the coercive force of the magnetic recording medium can be estimated by means of calculating either a difference or a ratio of the first reproduced output and the second reproduced output. Thus, an accuracy of identifying a low coercivity magnetic medium and a high coercivity magnetic medium can be improved.

As described above, the method for judging a coercive force of a magnetic recording medium according to the present invention makes it possible to definitely judge on the coercive force of the magnetic recording medium, having less chance of being affected by characteristics of the magnetic head and the magnetic recording medium as well as variation of a write current value.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which are conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

A method for judging a coercive force of a magnetic recording medium according to the present invention is a method for judging a coercive force of a magnetic recording medium, in order for recording magnetic information to be formed in either a low coercivity magnetic medium or a high coercivity magnetic medium by using a magnetic head, and the method includes a magnetic information recording step for writing magnetic information in the magnetic recording medium by alternately using a first write current suitable for writing in the low coercivity magnetic medium and a second write current suitable for writing in the high coercivity magnetic medium; a magnetic information, reproducing step for reproducing the magnetic information written in the magnetic recording medium; and a judging step for making a judgment on a coercive force of the magnetic recording medium by way of comparing a first reproduced output of the magnetic information written with the first write current and a second reproduced output of the magnetic information written with the second write current.

An embodiment of the present invention is described below with reference to the accompanying drawings.

Configuration of Medium Processing Device

Figure 1:
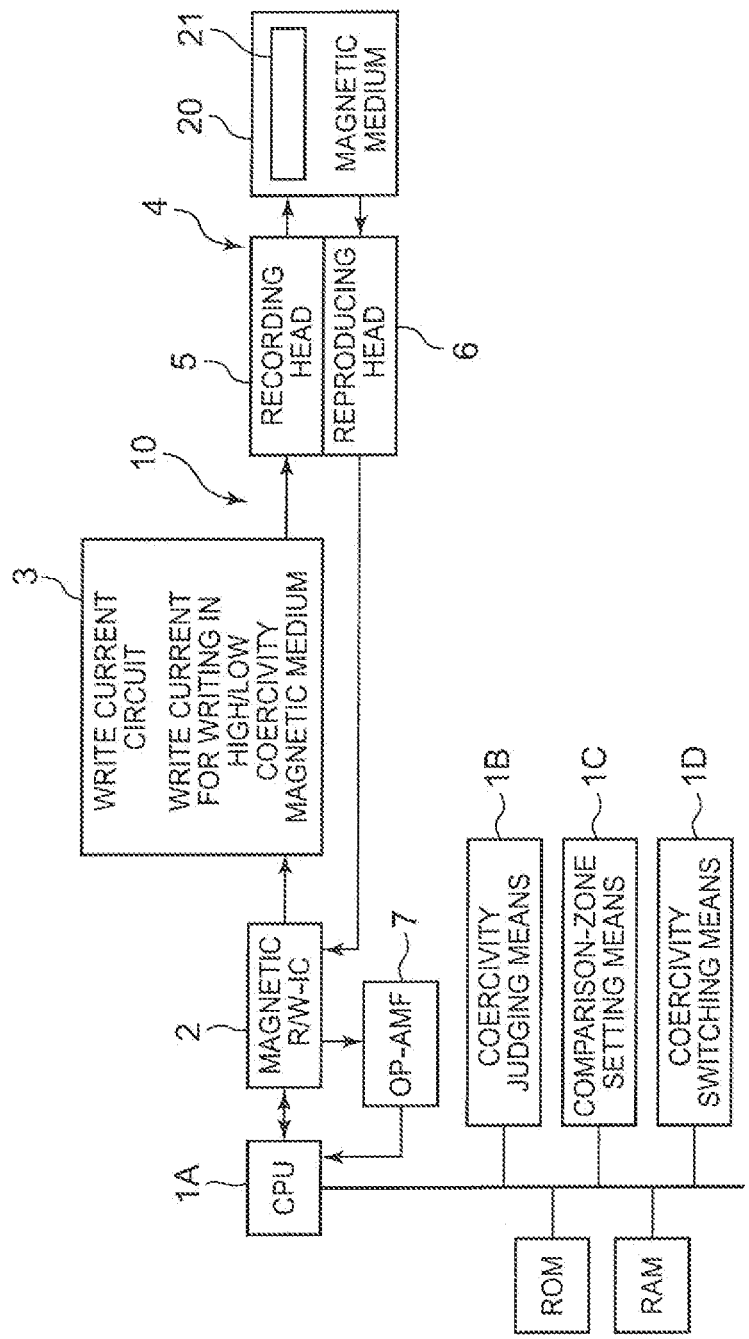
FIG. 1 is a block diagram showing a magnetic head and a control circuit of the magnetic head of a medium processing device that carries out a method for judging a coercive force of a magnetic recording medium according to the present invention.
Figure 2:
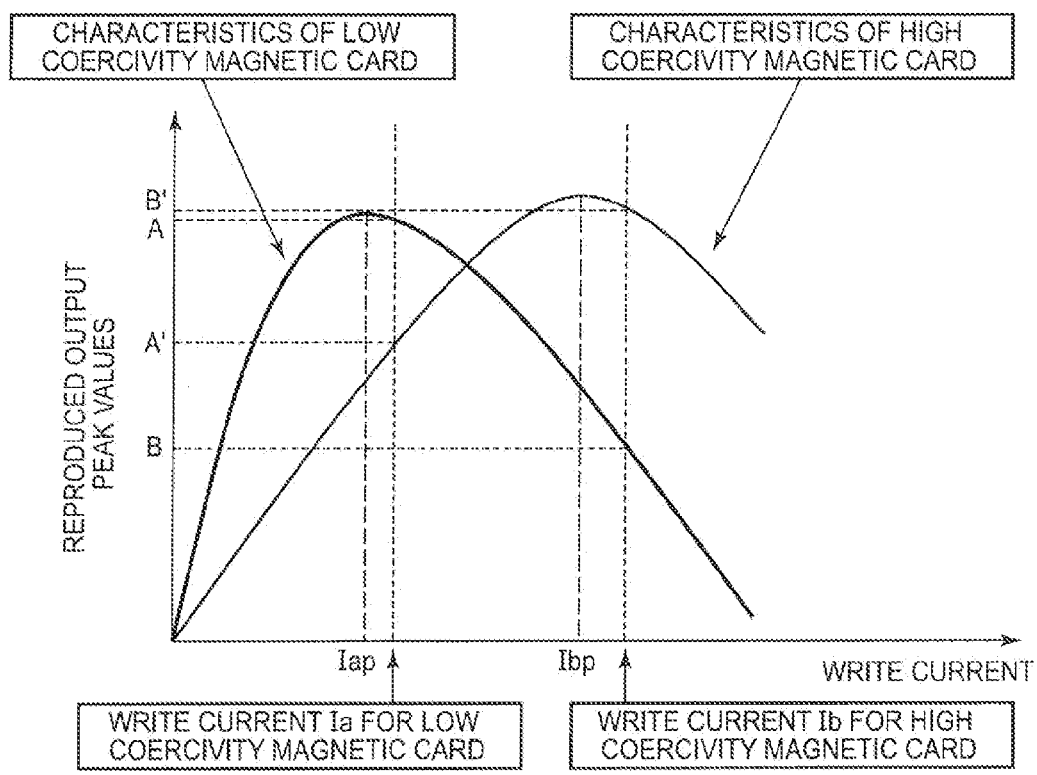
FIG. 2 is a graph showing saturation characteristics of a magnetic medium corresponding to each coercivity.
Figure 3:
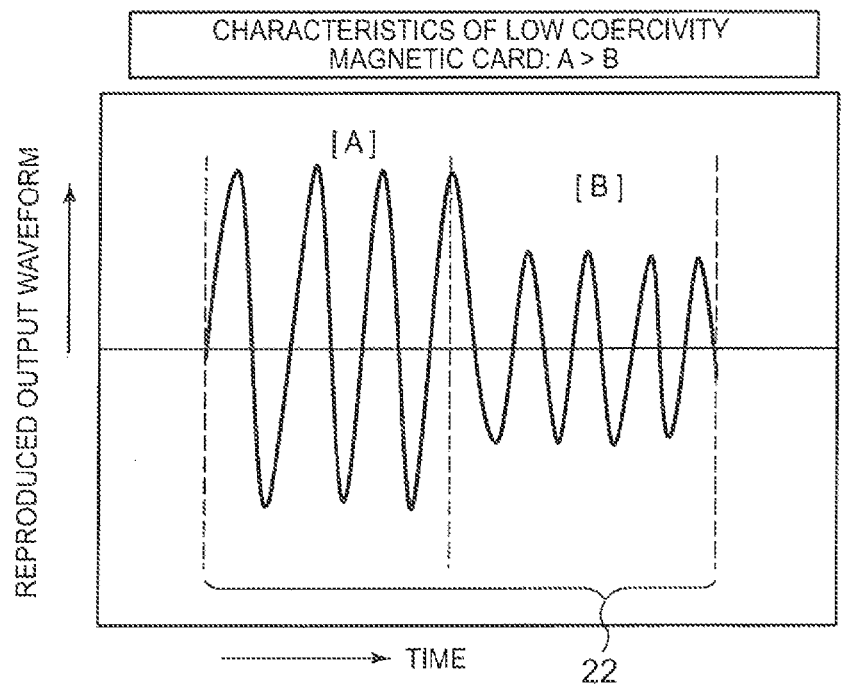
FIG. 3 is a graph showing a reproduced output waveform of a magnetic medium having low coercivity.
Figure 4:
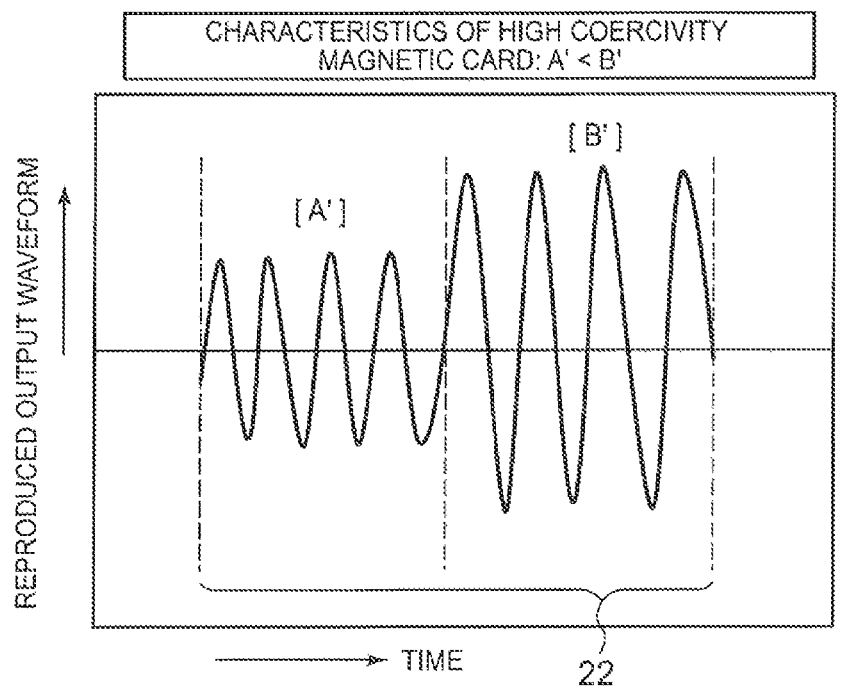
FIG. 4 is a graph showing a reproduced output waveform of a magnetic medium having high coercivity.
Figure 5:
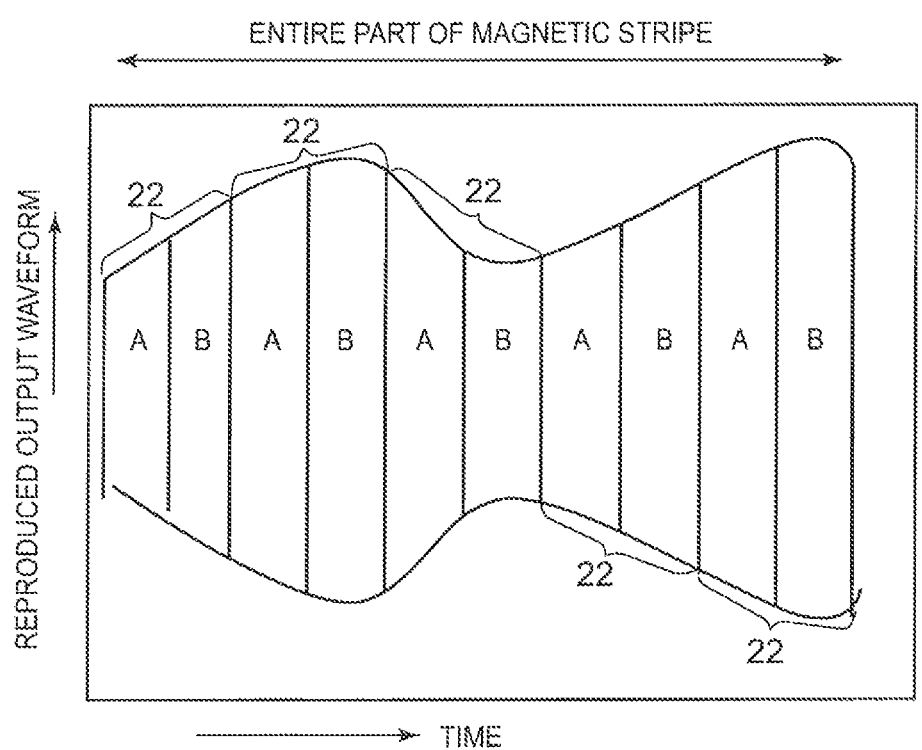
FIG. 5 is a graph showing an example of a zone for comparison where magnetic information according to different write current values is recorded.

FIG. 1 is a block diagram showing a magnetic head and a control circuit of the magnetic head of a medium processing device that carries out a method according to the present invention. FIG. 2 is a graph showing saturation characteristics of a medium corresponding to each coercivity. FIG. 3 is a graph showing a reproduced output waveform of a medium having low coercivity. FIG. 4 is a graph showing a reproduced output waveform of a medium having high coercivity. FIG. 5 is a graph showing an example of a zone for comparison where magnetic information according to different write current values is recorded.

An example of medium processing devices having a function for judging different coercive forces of magnetic recording media, in accordance with the present invention, is a magnetic card reader. The magnetic card reader has a magnetic card (a magnetic recording medium) inserted in an insertion slot of a main unit; and while transferring the magnetic card through an internal section of the main unit with a transfer means such as a roller, the magnetic card reader writes (record) or reads (reproduce) magnetic information by using a magnetic head provided in a transfer path.

A magnetic card 20 as a magnetic recording medium is, for example, a rectangular card made of polyvinyl chloride, having a thickness of about 0.7 to 0.8 mm. As shown in FIG. 1, formed on a surface of the magnetic card 20 is a magnetic record area (magnetic stripe) 21 where magnetic information is recorded. Incidentally, being other than the magnetic card 20, the magnetic recording medium may be a PET (polyethylene terephthalate) card having a thickness of about 0.18 to 0.36 mm, a paper card having a predetermined thickness, and the like.

In the present embodiment, the magnetic card reader is to deal with, for example, two types of magnetic cards as media having different coercive forces; namely, a magnetic card with low coercivity 300 Oe, and a magnetic card with high coercivity of 2750 Oe.

In such a magnetic card reader, a control circuit 10 and a magnetic head 4 are configured, as shown in FIG.

The control circuit 10 includes a control section 1, a magnetic R/W-IC 2, a write current circuit 3, a magnetic head 4, and an operational amplifier 7.

The control section 1 includes: a CPU 1A for controlling the magnetic head 4 and an entire part of the control circuit; a coercivity judging means 1B for judging a coercive force of magnetic information written in the magnetic stripe 21; a comparison-zone setting means 1C for segmenting into a zone for writing with low coercivity and a zone for writing with high coercivity in the magnetic stripe 21; and a coercivity switching means 1D for switching a write current to make it suitable for writing in a zone determined by the comparison-zone setting means 1C. Moreover, the CPU 1A includes a ROM for storing a program that controls the control circuit, and a RAM for saving control data in such a way as to be readable.

Incidentally, in the present embodiment, the CPU 1A is able to control, for example, a transfer mechanism (not shown) for transferring the magnetic card 20 as well, in addition to the magnetic head 4 and the control circuit.

The coercivity judging means 1B makes a judgment on coercivity of magnetic information of a sensor and so on (not shown) for detecting positions of the magnetic stripe 21 and the magnetic recording medium, the magnetic information being written in an entire part of the magnetic card reader. Specifically to describe, saturation characteristics of a low coercivity magnetic card and a high coercivity magnetic card are shown as waveforms illustrated in FIG. 2; and the coercivity of the magnetic card 20 is identified by making use of a difference in reproduced output (peak values) of the saturation characteristics in the low coercivity magnetic card and the high coercivity magnetic card. As shown in FIG. 2, in the case of the low coercivity magnetic card, a reproduced output value A at a first write current Ia is greater than a reproduced output value B at a second write current Ib. The reproduced output value A represents a reproduced output peak value in the case of the low coercivity magnetic card, and meanwhile the high coercivity magnetic card does not have a peak value. Next, a reproduced output value A' at the second write current Ib is less than a reproduced output value B' at the second write current Ib. The reproduced output value B' represents a reproduced output peak value in the case of the high coercivity magnetic card, and meanwhile the low coercivity magnetic card does not have a peak value. Incidentally, the reproduced output value A or the reproduced output value A' corresponds to a 'first reproduced output value', and the reproduced output value B or the reproduced output value B' corresponds to a 'second reproduced output value.'

In the present embodiment, the magnetic information written in the magnetic card 20 is reproduced with a reproducing head 6 to obtain reproduced output waveforms having a certain frequency, as shown in FIG. 3 and FIG. 4. The coercivity judging means 1B makes a comparison between the reproduced output value A of the magnetic information written with the first write current Ia and the reproduced output value B of the magnetic information written with the second write current Ib.

For example, FIG. 3 is a graph showing a reproduced output waveform of the magnetic card 20 having low coercivity. In the graph, the reproduced output value A (almost the same as the reproduced output peak value) is greater than the reproduced output value B, and therefore it is judged on the basis of the saturation characteristics shown in FIG. 2 that the magnetic card 20 is a low coercivity magnetic card. In the meantime, FIG. 4 is a graph showing a reproduced output waveform of the magnetic card 20 having high coercivity. In the graph, the reproduced output value A' is less than the reproduced output value IV (almost the same as the reproduced output peak value), and therefore it is judged on the basis of the saturation characteristics shown in FIG. 2 that the magnetic card 20 is a high coercivity magnetic card.

Incidentally, in the present embodiment, the magnetic information recorded in the magnetic card 20 is written in the 1F frequency of the F2F recording method for magnetic card readers and so on. In other words, the reproduced output waveforms shown in FIG. 3 and FIG. 4 are waveforms in the 1F frequency in general, an FM modulation method in which binary magnetic information is recorded in the magnetic card 20 by way of combining two kinds of frequency, namely 'F' and '2F', is known as a magnetic recording method to be used for medium processing devices such as a magnetic card reader. More specifically to describe, '1F' is magnetic information having one-time change in a certain time period, and meanwhile '2F' is magnetic information having two-time change in a certain time period. Then, the magnetic information of '1F' and '2F' represents '0' and '1', respectively, as a result of binarization. Incidentally, the magnetic information may be written in the 2F frequency.

The comparison-zone setting means 1C sets zones in the magnetic stripe 21, segmented into two or more in a longitudinal direction. In the segmented zones (comparison zones), magnetic information with a write current value being specific to each comparison zone is recorded. Specifically to describe, in a comparison zone 22 shown in FIG. 3, a zone named as 'A' is where magnetic information is written with the first write current Ia suitable for writing in a low coercivity magnetic medium, and meanwhile a zone named as "B" is where magnetic information is written with the second write current Ib suitable for writing in a high coercivity magnetic medium. In the same manner, in a comparison zone 22 shown in FIG. 4, a zone named as "A'" is where magnetic information is written with the first write current Ia suitable for writing in a low coercivity magnetic medium, and meanwhile a zone named as "B'" is where magnetic information is written with the second write current Ib suitable for writing in a high coercivity magnetic medium.

Even if magnetic information is written in the magnetic card 20 while a write current value and a recording frequency being kept constant, peak values in a reproduced output waveform sometimes do not become uniform, as shown in FIG. 5. Considered as reasons for the phenomenon are variation by location with respect to magnetic characteristics (coercivity and a thickness of the medium) of the magnetic card 20, variation by location with respect to a space between the magnetic stripe and the magnetic head owing to deformation of the magnetic card 20, and the like.

Accordingly, in order to improve judgment accuracy even in the case of peak values not being uniform in a reproduced output waveform, the magnetic stripe 21 is segmented into two or more in a longitudinal direction, as shown in FIG. 5; and then, magnetic information with a write current value being specific to each comparison zone 22 is written in the magnetic stripe 21 by using a recording head 5. In the present embodiment, comparison zones 22 are set as five segments by equally segmenting the magnetic stripe 21 in the longitudinal direction, as shown in FIG. 5. To describe more in detail, in the case of the magnetic card reader of the present embodiment, the magnetic stripe 21 is set, being equally segmented into five sections; and since the magnetic card 20 is transferred at a con stain speed in relation to the magnetic head 4, the magnetic stripe 21 is set by equally time-wise segmentation.

Incidentally, although segmenting the magnetic stripe 21 into a greater number of comparison zones 22 leads to a further improvement of judgment accuracy, the number of segmented comparison zones is determined for each machine, to which the present invention is applied, by taking into account a process performance of the CPU 1A, a response time performance of the write current circuit 3 for switching the write current value, a degree of non-uniformity of peak values in the reproduced output waveform, and the like. For medium processing devices such as a magnetic card reader, it is preferable to segment the magnetic stripe 21 into two to ten sections. In the present embodiment, the comparison zones are equally segmented among the comparison zones 22, but they are not limited to such an arrangement. Furthermore, if the peak values in the reproduced output waveform are uniform all over the magnetic stripe 21, it is not needed to segment the magnetic stripe 21. In such a case, for an entire part of the magnetic stripe 21, magnetic information may be written by using the first write current is and the second write current Ib one time each.

The coercivity switching means 1D is to switch the write current so as to be suitable for writing in the comparison zones 22 determined by the comparison-zone setting means 1C.

The magnetic head 4 includes the recording head 5 and the reproducing head 6. The recording head 5 writes (records) magnetic information into the magnetic card 20, and meanwhile the reproducing head 6 reads (reproduces) magnetic information recorded in the magnetic card 20. In the present embodiment, the recording head 5 is an element for high coercivity such as 2,750 Oe, and it can also be used as an element for low coercivity of 300 Oe by switching the magnitude of the write current.

Moreover, FIG. 2 is a graph showing saturation characteristics of a low coercivity magnetic card and a high coercivity magnetic card; and a horizontal axis represents write current values, and a vertical axis shows reproduced output values in the graph. In FIG. 2, a thick solid line shows relationships between the reproduced output of the low coercivity magnetic card and the first write current Ia, and meanwhile a thin solid line shows relationships between the reproduced output of the high coercivity magnetic card and the second write current Ib.

With respect to write current values under this situation, the first write current Ia is usually specified with a current value of about 1.5 to 5 times a write current for obtaining 80% output of what is brought in by a saturation current value Iap for reproduced output. The first write current it specified in this way is for writing magnetic information by using a current of a graph part having less fluctuation of output in relation to current variation, and thus the first write current Ia is generally considered to be most appropriate as a write current. In the same manner, the second write current Ib is specified with a current value of about 1.5 to 5 times a write current for obtaining 80% output of what is brought in by a saturation current value Ibp for a magnetic card with high coercivity (2,750 Oe).

The write current circuit 3 supplies the recording head 5 with the first write entreat Ia that is suitable for writing in a magnetic card 20 with low coercivity, and the second write current Ib that is suitable for writing in a magnetic card 20 with high coercivity, in order to write magnetic information with a write current of an appropriate value according to coercivity of those magnetic cards 20. Specifically, as described above, the recording head 5 is supplied with the first write current Ia and the second write current Ib, as shown in FIG. 2.

Moreover in the present embodiment, the recording head 5 is also used for erasing magnetic information recorded in magnetic cards 20 with low coercivity and with high coercivity. Specifically to describe, in order for DC-erasing (Direct-Current-erasing) of the magnetic cards 20 by using the recording head 5, specified are one current value (for example, about 20 to 30 mA) with which only low coercivity (300 Oe can be erased, as well as the other current value (for example, 120 mA, or more) with which both low coercivity and high coercivity (2750 Oe) can be erased.

Being placed between the write current circuit 3 and the CPU 1A, the magnetic R/W-IC 2 is a control circuit that controls a magnetic-writing current of the write current circuit 3 to the recording head 5 in accordance with a command from the CPU 1A. In the present embodiment, the magnetic RAW-IC 2 controls signal exchange with the recording head 5 that writes (records) magnetic information in the magnetic stripe 21 provided in the magnetic card 20, and the reproducing head 6 that reads (reproduces) magnetic information. Thus, it becomes possible for the recording head 5 to cope with low coercivity (300 Oe) and high coercivity (2,750 Oe). Furthermore in the present embodiment, the magnetic R/W-IC 2 controls inputs/outputs of the magnetic head 4 at the time of receiving an I/O command from the CPU 1A.

The operational amplifier 7 amplifies magnetic information of the magnetic card 20, which is read by using the reproducing head 6, and enters the amplified magnetic information, as a reproduced output, to an analog port of the CPU 1A.

An Embodiment of a Method for Judging Coercivity

Figure 6:
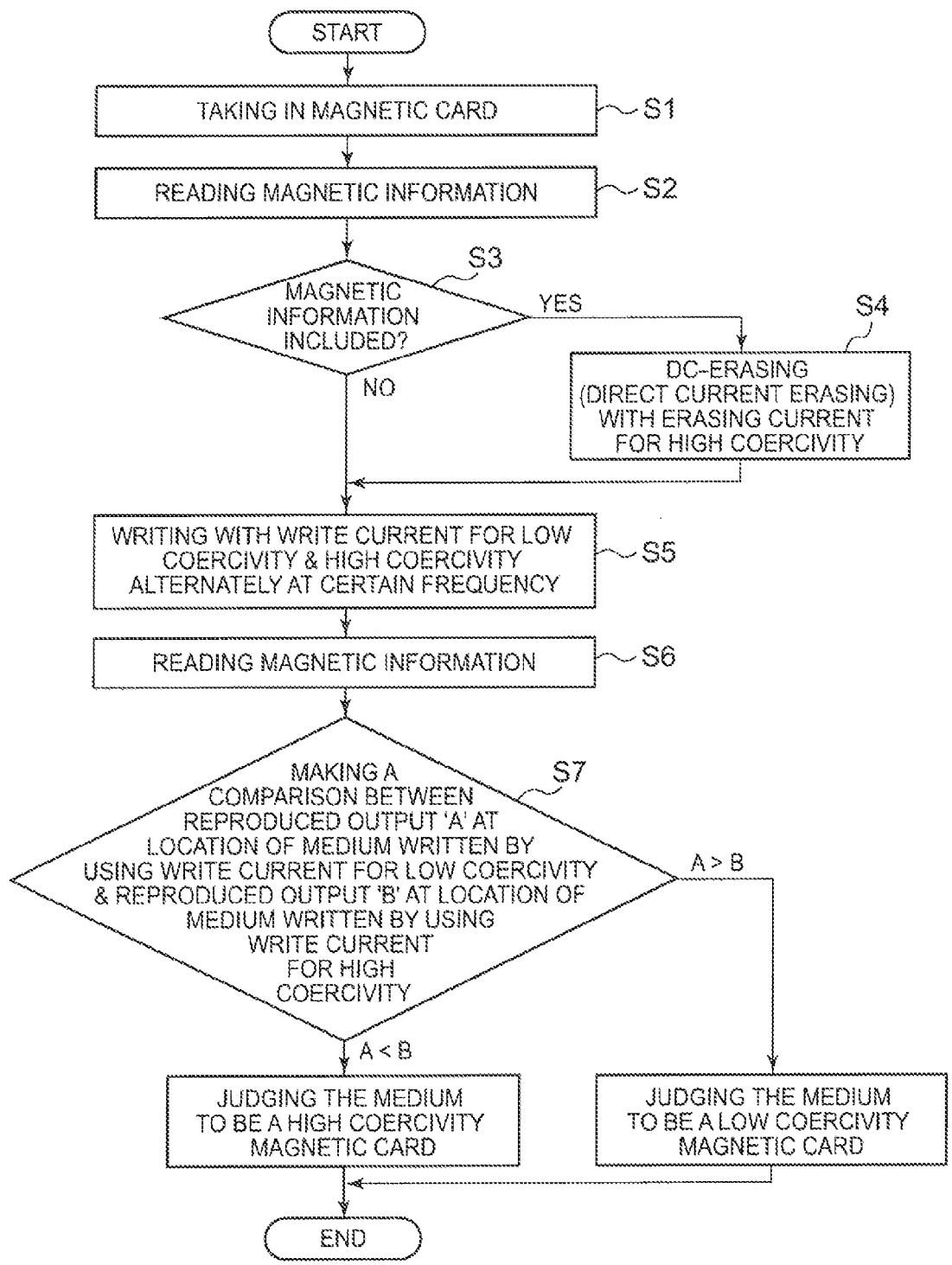
FIG. 6 is a flowchart showing an embodiment of a method for judging a coercive force of a magnetic recording medium according to the present invention.

Explained next is a method for judging a coercive force of a magnetic card, to be carried out in the magnetic card reader described above. FIG. 6 is a flowchart showing an embodiment of a method for judging a coercive force of a magnetic card, according to the present invention.

A method for judging a coercive force of the magnetic card 20, shown in FIG. 6, is for recording magnetic information to be formed in the magnetic card 20 having either low coercivity or high coercivity, by using the recording head 5; the method including a magnetic information recording step for writing the magnetic information in the magnetic card 20 by alternately using the first write current Ia and the second write current Ib for writing in the magnetic card 20 having low coercivity; a magnetic information reproducing step for reproducing the magnetic information written in the magnetic card 20; and a judging step for making a judgment on a coercive force of the magnetic card 20 by way of comparing a reproduced output value A of the magnetic information written with the first write current Ia suitable for writing in a low coercivity magnetic medium, and a reproduced output value B of the magnetic information written with the second write current Ib suitable for writing in a high coercivity magnetic medium; as principal steps.

As shown in FIG. 6, the magnetic card reader detects the magnetic card 20 having been inserted in a card insertion slot with a sensor and the like, and takes the magnetic card 20 into an internal section of a main unit (Step S1). At first, the magnetic card 20 is inserted through the card insertion slot in the magnetic card reader.

While the magnetic card 20 inserted through the card insertion slot being transferred inside the main unit, by a transfer means, not shown, such as a roller and the like; the reproducing bead 6 provided in a transfer path reads the magnetic information formed in the magnetic stripe 21 (Step S2).

The CPU 1A checks to see whether or not a reproduced output read out by the reproducing head 6 includes magnetic information (Step S3). Incidentally, Step S3 is called a checking step.

If the CPU 1A judges that magnetic information is written in the magnetic card 20, the write current circuit 3 supplies the recording head 5 with an erasing current with which magnetic information, of the magnetic card 20 having high coercivity can be erased, to DC-erase (direct-current-erase) the magnetic information recorded in the magnetic card 20 (Step S4). The magnetic information recorded in the magnetic stripe 21 is direct-current-erased with the recording head 5 used as a direct-current-erasing head, and a magnetization state in the magnetic stripe 21 is homogenized. Incidentally, Step S4 is called an erasing step.

On the other hand, if the CPU 1A judges at Step S3 that magnetic information is not written in the card 20, operation proceeds to a next step, i.e., a magnetic information recording step (S5) without carrying out the erasing step (Step S4).

The recording head 5 writes (records) magnetic information for a judgment in the magnetic stripe 21, with either the first write current Ia or the second write current Ib (Step S5). Incidentally, Step S5 is called a magnetic information recording step. On this occasion, the comparison-zone setting means 1C of the CPU 1A segments the magnetic stripe 21, in which the magnetization state is homogenized, in its longitudinal direction so as to set the comparison zones 22 that are equally segmented in five sections, as shown in FIG. 5. Moreover, the control section 1 replaces the reproducing head 6 with the recording head 5 by the intermediary of the magnetic R/W-IC 2. The recording head 5 is supplied with either the first write current Ia suitable for writing in a magnetic card 20 having low coercivity, or the second write current Ib suitable for writing in a magnetic card 20 having high coercivity, from the write current circuit 3. Then, the recording head 5 slides on the magnetic stripe 21 of the magnetic card 20 being transferred, in such a way that magnetic information is written (recorded) in the magnetic stripe 21.

In the present embodiment, the magnetic information for a judgment is written by using the first write current Ia suitable for writing in the magnetic card 20 having low coercivity, in a zone illustrated as within each comparison zone 22 that has been set. Next, the magnetic information for a judgment is written by using the second write current Ib suitable for writing in the magnetic card 20 having high coercivity, in a zone illustrated as "B". Incidentally, in the present embodiment, the magnetic information to be recorded in the magnetic card 20 is written in the 1F frequency of the F2F recording method for magnetic card readers and so on.

Even after writing in the comparison zones 22 in this way while a write current value and a recording frequency being kept constant, peak values in a reproduced output waveform sometimes do not become uniform, as shown in FIG. 5. Considered as reasons far the phenomenon are variation by location with respect to magnetic characteristics (coercivity and a thickness of the medium) of the magnetic card 20, variation by location with respect to a space between the magnetic stripe and the magnetic head owing to deformation of the magnetic card 20, and the like.

In the present embodiment, magnetic information is recorded by using the first write current Ia suitable for writing in the magnetic card 20 having low coercivity and the second write current Ib suitable for writing in the magnetic card 20 having high coercivity alternately in this order. On the contrary, magnetic information may be recorded by using the second write current Ib suitable for writing in the magnetic card 20 having high coercivity and the first write current Ia suitable for writing in the magnetic card 20 having low coercivity alternately in this order.

Then, the reproducing head 6 reads (reproduces) the magnetic information written in the magnetic card 20 (Step S6). Incidentally, Step S6 is called a magnetic information reproducing step. On this occasion, after writing the magnetic information in the magnetic stripe 21 of the magnetic card 20, the control section 1 turns over a transfer direction of the magnetic card 20 by using the transfer means, not shown, and so on. Moreover, the control section 1 replaces the recording head 5 with the reproducing head 6 by the intermediary of the magnetic R/W-IC 2. The reproducing head 6 slides on the magnetic stripe 21 to output a reproduced signal. Then, a reproduced output waveform of a certain frequency; for example, as shown in FIG. 3 and FIG. 4; enters the CPU 1A.

The coercivity judging means 1B of the CPU 1A makes a comparison in the magnetic information for judgment read out by the reproducing head 6, with respect to each comparison zone 22, between the reproduced output value A of the magnetic information written by using the first write current Ia suitable for writing in the magnetic card 20 having low coercivity and the reproduced output value B of the magnetic information written by using the second write current Ib suitable for writing in the magnetic card 20 having high coercivity, in order to make a judgment on a coercive force of the magnetic card 20 (Step S7). Incidentally, Step S7 is called a judging step.

In the present embodiment, on the basis of the saturation characteristics of low coercivity or high coercivity, as shown in FIG. 2, the coercivity judging means 1B is able to judge that the magnetic card 20 is a low coercivity magnetic medium if the reproduced output value A is greater than the reproduced output value B (as shown in FIG. 3), and the magnetic card 20 is a high coercivity magnetic medium if the reproduced output value A' is less than the reproduced output value B' (as shown in FIG. 4). Incidentally as a method for comparing the reproduced output value A with the reproduced output value B, the coercive force of the magnetic card 20 may be obtained by way of calculating either a difference or a ratio of the reproduced output value A and the reproduced output value B. Thus, a value of the coercive force of the magnetic card 20 can be estimated, and an accuracy of identifying a low coercivity magnetic medium and a high coercivity magnetic medium can be improved.

Advantageous Effect of the Present Embodiment

In the method for judging a coercive force according to the present embodiment, compared are the reproduced output value A of the magnetic information written by using the First write current as suitable for writing in the magnetic card 20 having low coercivity and the reproduced output value B of the magnetic information written by using tire second write current Ib suitable for writing in the magnetic card 20 having high coercivity, in order to make a judgment. Thus, it is possible to judge whether the magnetic card 20 is a low coercivity magnetic medium or a high coercivity magnetic medium. As described above, in the method for judging a coercive force according to the present embodiment, a judgment is made on the coercive force of the magnetic card 20, on the basis of magnitude of the reproduced output (reproduced output peak values). Therefore, a judgment result is unlikely to be affected by variation of the reproduced output from the reproducing head 6, though conventionally it was likely to be affected, so that a judgment result with high reliability can be obtained.

Furthermore, since the magnetic card reader is configured with a commonly-used circuit and software in the present embodiment, neither a new circuit nor an extra mechanism is needed for conducting the method for judging coercivity according to the present embodiment, so as to enable a cost reduction.

Furthermore, since the present embodiment has the checking step (Step S3) for checking a presence of magnetic information by way of reproducing magnetic information written in the magnetic card 20 before the magnetic information recording step (Step S5), it is possible to make sure in advance whether or not magnetic information is written in the magnetic card 20. Therefore, operation can proceed to an appropriate step, for example directly to the magnetic information recording step (Step S5) if no magnetic information is written in the magnetic card 20, according to the presence status of magnetic information.

Next, provided is the erasing step (Step S4) for erasing magnetic information with an erasing current of a value, with which magnetic information of the magnetic card 20 having high coercivity can be erased, in the case where magnetic information is written in the magnetic card 20 at the checking step (Step S3). Therefore, a judgment on a coercive force can be made by way of comparing the reproduced output of magnetic information for a judgment, which has been written at the magnetic information recording step (Step S5) by using the first write current as or the second write current Ib, so that it is possible to eliminate influence that the magnetic information already written in the magnetic card 20 has on a judgment result. Moreover, in the present embodiment, magnetic information is erased with an erasing current of a value, with which magnetic information of the magnetic card 20 having high coercivity can be erased. Therefore, even if the magnetic card 20 is a low coercivity magnetic medium, the magnetic information can be erased.

Furthermore, at the magnetic information recording step (Step S5), the magnetic stripe 21, where magnetic information of the magnetic card 20 is recorded, is set in its longitudinal direction so as to be comparison zones (five equally segmented zones in the present embodiment). Then, with respect to each of the comparison zones 22 being segmented, magnetic information is written in the magnetic stripe 21 by using the first write current Ia and the second write current Ib alternately. Thus, it is possible to suppress variation of the reproduced output owing to deformation of the magnetic card 20, variation of magnetic characteristics, and variation with respect to a space between the magnetic card 20 and the magnetic head 4; and if is possible to obtain a judgment result with higher reliability. In this way, under a situation where the peak values of a reproduced output waveform are not uniform, judgment accuracy can be improved by means of writing magnetic information in the magnetic stripe 21 with the use of the first write current Ia and the second write current Ib alternately in each of the comparison zones 22.

Another Embodiment of a Method for Coercivity

Figure 9:
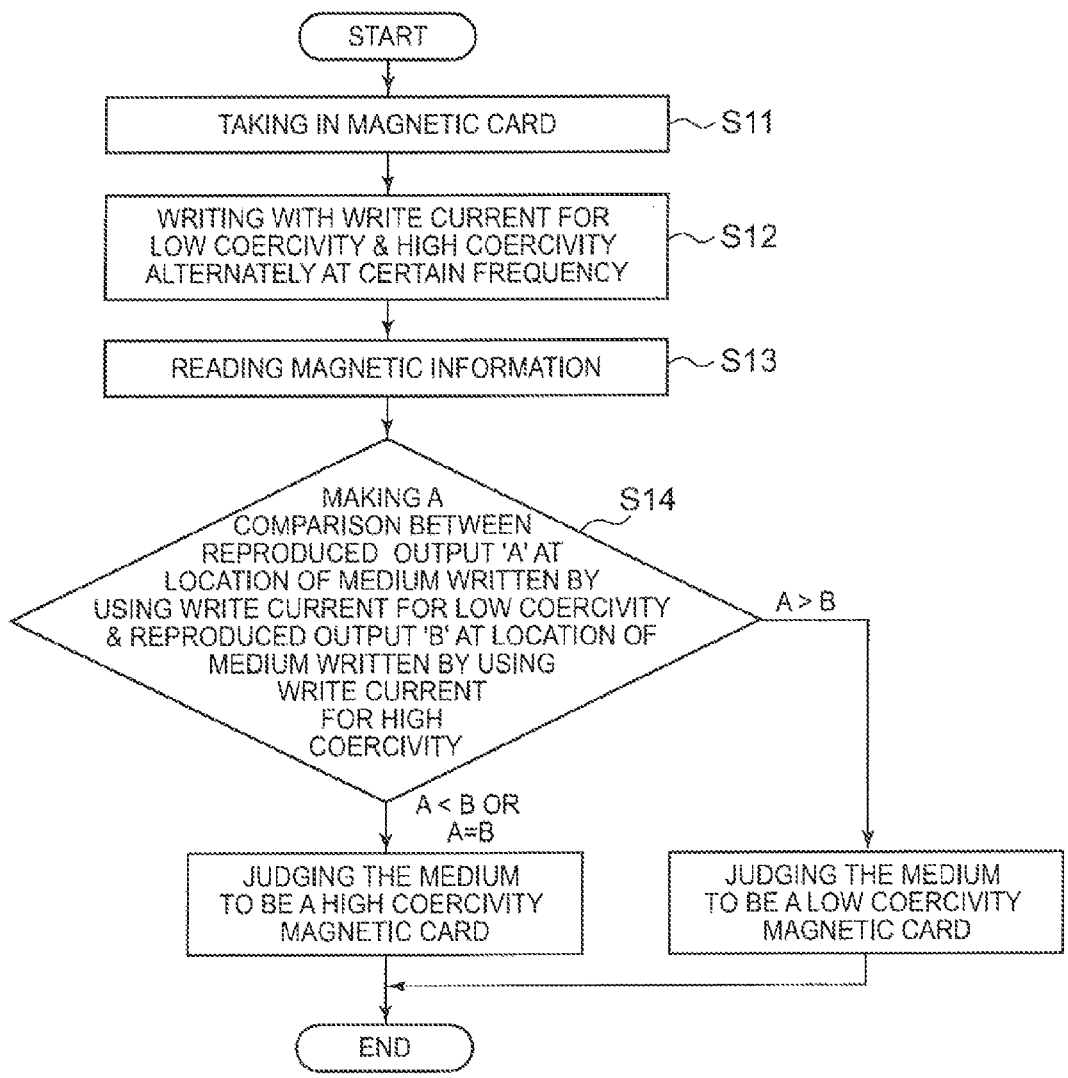
FIG. 9 is a flowchart showing another embodiment of a method for judging a coercive force of a magnetic recording medium according to the present invention.

FIG. 9 is a flowchart showing another embodiment of a method for judging a coercive force of a magnetic card according to the present invention.

In the method for judging a coercive force of the magnetic card 20, shown in FIG. 9 the magnetic card reader detects the magnetic card 20 having been inserted in a card insertion slot with a sensor and the like, and takes the magnetic card 20 into an internal section of a main unit (Step S11: equivalent to Step S1 shown in FIG. 6).

The recording head 5 writes (records) magnetic information for a judgment in the magnetic stripe 21, with either the first write current Ia or the second write current Ib (Step S12). Specifically, magnetic information is written in the magnetic card 20 by alternately using the first write current Ia suitable for writing in the magnetic card 20 having low coercivity and the second write current Ib suitable for writing in the magnetic card 20 having high coercivity. Incidentally, Step S12 is called a magnetic information recording step, which is equivalent to Step S5 shown in FIG. 6.

Incidentally, the magnetic stripe 21, where magnetic information of the magnetic card 20 is recorded, may be set in its longitudinal direction at the magnetic information recording step (S12), so as to be comparison zones (five equally segmented zones in the present embodiment), in the same manner as it is in the above-mentioned embodiment. Then, with respect to each of the comparison zones 22 being segmented, magnetic information may be written in the magnetic stripe 21 by using the first write current Ia and the second write current Ib alternately.

Then, the reproducing head 6 reads (reproduces) the magnetic information written in the magnetic card 20 (Step S13). Incidentally, Step S13 is called a magnetic information reproducing step, which is equivalent to Step S5 shown, in FIG. 6. At Step S13, the reproducing head 6 reproduces the magnetic information written in the magnetic card 20, in the same manner as it does at Step 5. Then, a reproduced output waveform of a certain frequency; for example, as shown in FIG. 3 and FIG. 4; enters the CPU 1A.

The coercivity judging means 1B of the CPU 1A makes a comparison in the magnetic information for judgment read out by the reproducing head 6, with respect to each comparison zone 22, between the reproduced output value A of the magnetic information written by using the first write current is suitable for writing in the magnetic card 20 having low coercivity and the reproduced output value B of the magnetic information written by using the second write current Ib suitable for writing in the magnetic card 20 having high coercivity; in order to make a judgment on a coercive force of the magnetic card 20. Incidentally, this Step S14 is called a judging step, which is equivalent to Step S7 shown in FIG. 6.)

Being different from the judging step (Step S6) shown in FIG. 6, the judging step (Step S14) judges that the magnetic card 20 is a low coercivity magnetic medium if the reproduced output value A is greater than the reproduced output value B, and otherwise judges that the magnetic card 20 is a high coercivity magnetic medium. As shown in FIG. 2, a difference in the reproduced output values (B'-A') in the case of the magnetic card 20 having high coercivity is generally less than a difference in the reproduced output values (A-B) in the case of the magnetic card 20 having low coercivity. Accordingly, there comes up a chance that the judging step (Step S14) has a difficulty in recognizing the difference, in the reproduced output values (B'-A') in the case of the magnetic card 20 having high coercivity B'=A'). Under such conditions, if it is judged that the card is a high coercivity magnetic medium unless A' is greater than B', a situation of judgment being impossible can be avoided. Therefore, a judgment result can be obtained for sure.

In the embodiment shown in FIG. 9, the magnetic card 20 having low coercivity, which can easily be recognized, is judged to be a low coercivity magnetic medium if the reproduced output value A is greater than the reproduced output value B; and thus the magnetic card 20 can still be recognized to be a high coercivity magnetic medium even though it is impossible to make a judgment on the difference in the reproduced output values of magnetic information.

Other Embodiments

Figure 7:
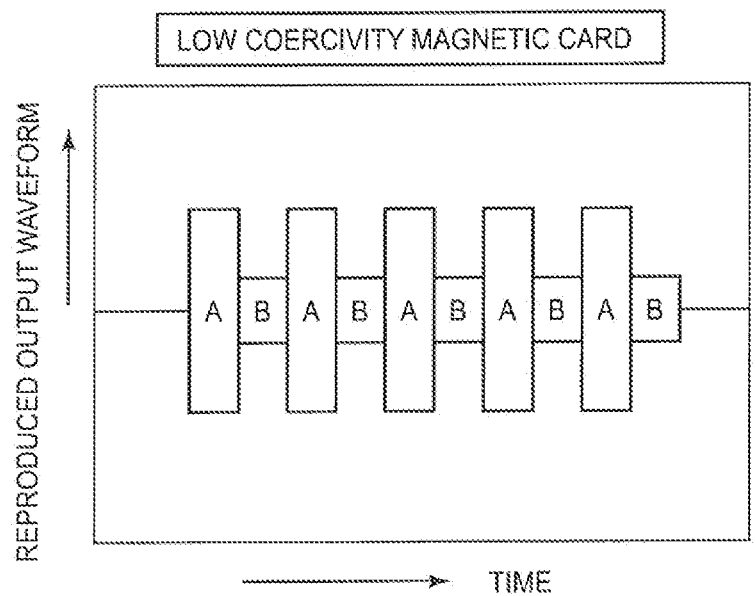
FIG. 7 is a diagram showing a situation of judging a coercive force of a magnetic recording medium.
Figure 8:
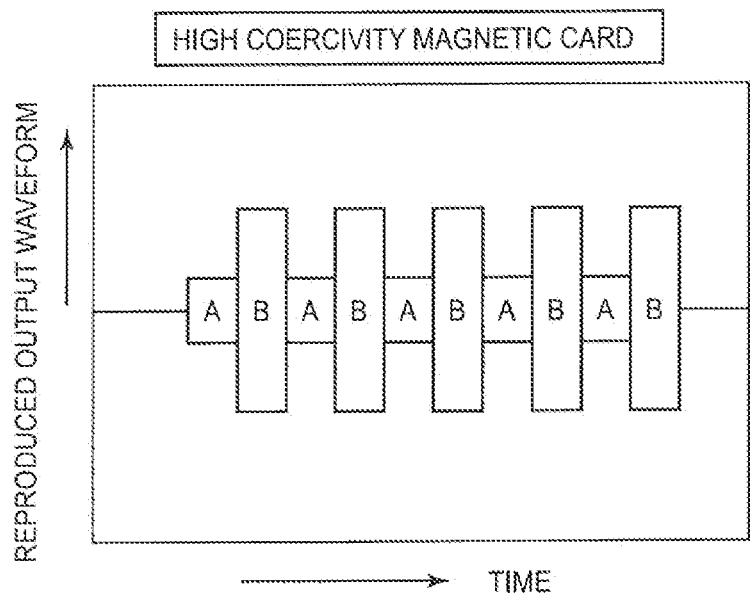
FIG. 8 is a diagram showing a situation of judging a coercive force of a magnetic recording medium.

According to the method for judging a coercive force of the present invention, when reproduced output (reproduced output peak values) is obtained, for example as shown in FIG. 7 and FIG. 8, average values of reproduced output (the reproduced output value A and the reproduced output value B) of magnetic information written in a plurality of comparison zones by applying the same write current value are individually calculated. Then, a judgment can be made on a coercive force of the magnetic card 20 by making comparison on the average values of reproduced output. In this way, by making comparison on the average values of reproduced output, variation of the reproduced output is suppressed so chat a judgment result with higher reliability can be obtained.

Moreover, although magnetic information is written in the magnetic card 20 at the magnetic information recording step described above, by alternately using the first write current Ia suitable for writing in the magnetic card 20 having low coercivity and the second write current Ib suitable for writing in the magnetic card 20 having high coercivity, the magnetic information recording step is not limited to this configuration. For example, provided may be a means for writing magnetic information in a magnetic recording medium by using three or more write current values in turns. According to such a method if magnetic information is written in a magnetic recording medium at the magnetic information recording step by using three or more write current values in turns, it is possible to recognized not only a low coercivity magnetic medium and a high coercivity magnetic medium, but also a few kinds of coercive forces; for example, a low coercive force (e.g., 650 Oe or lower), a medium coercive force (e.g., about 1,500 Oe), and a high coercive force (e.g., 2,750 Oe or higher).

Furthermore, if the peak values in the reproduced output waveform are uniform all over the magnetic stripe 21, it is not needed to segment the magnetic stripe 21. In such a case, the comparison-zone setting means 1C may set up in such a way that magnetic information is written for an entire part of the magnetic stripe 21, by using the first write current Ia and the second write current Ib one time each.

Moreover, although it is explained in the present embodiment that the comparison zones extend for an entire part of the magnetic stripe 21, the comparison zones are not limited to this configuration, but may exist in a predetermined area in a longitudinal direction. Concretely to describe, the comparison zones may extend for about half the entire part of the magnetic stripe 21, namely a first half or a second half. Furthermore, alternatively for example, the comparison zones may be set around a middle part of the magnetic stripe 21 in its longitudinal direction.

In the present embodiment, magnetic information is recorded by using the first write current Ia (reproduced output area A) suitable for writing in the magnetic card 20 having low coercivity and the second write current Ib (reproduced output area B) suitable for writing in the magnetic card 20 having high coercivity alternately in this order, as shown in FIG. 5. On the contrary, magnetic information may be recorded by using the second write current Ib suitable for writing in a high coercivity magnetic card and the first write current Ia, suitable for writing in a low coercivity magnetic card alternately in this order.

Furthermore, although the checking step (Step S3) is provided in the present embodiment, applied may be a configuration in which the checking step (S3) is not provided but the erasing step (Step S4) is always carried out.

INDUSTRIAL APPLICABILITY

The method for judging a coercive force of a magnetic recording medium according to the present invention is useful for enabling a definite judgment on the coercive force of the magnetic recording medium, without being affected by characteristics of the magnetic head and the magnetic recording medium as well as variation of a write current value.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative not limiting. Various changes may be made without departing from the spirit and scope of the inventions as defined in the following claims.

REFERENCE NUMERALS

1. CPU
2. Magnetic R/W-IC
3. Write current circuit
4. Magnetic head
5. Recording head
6. Reproducing head
7. Operational amplifier
10. Magnetic card reader (Medium processing device)
20. Magnetic card (Magnetic recording medium)
21. Magnetic stripe (Magnetic record area)
22. Comparison zone

What is claimed is:

1. A method for judging a coercive force of a magnetic recording medium, in order for recording magnetic information to be formed in either a low coercivity magnetic medium or a high coercivity magnetic medium by using a magnetic head, the method comprising:
    a magnetic information recording step comprising writing magnetic information in the magnetic recording medium by alternately using a first write current sufficient to write magnetic information in a low coercivity magnetic medium, and a second write current sufficient to write magnetic information in a high coercivity magnetic medium;
    a magnetic information reproducing step comprising reproducing the magnetic information written in the magnetic recording medium; and
    a judging step comprising making a judgment on a coercive force of the magnetic recording medium by way of comparing a first reproduced output of the magnetic information written with the first write current and a second reproduced output of the magnetic information written with the second write current;
    wherein the magnetic information recording step further comprises:
        segmenting a magnetic record area, where magnetic information of the magnetic recording medium is recorded, in its longitudinal direction into comparison zones;
        wherein the magnetic information is written in the magnetic record area by alternately using the first write current and the second write current with respect to each of the segmented comparison zones.

2. The method for judging a coercive force of a magnetic recording medium according to claim 1;
    wherein the judging step judges that the magnetic recording medium is a low coercivity magnetic medium if the first reproduced output is greater than the second reproduced output, and otherwise judges that the magnetic recording medium is a high coercivity magnetic medium.

3. The method for judging a coercive force of a magnetic recording medium according to claim 1, further comprising:
a checking step comprising checking a presence of magnetic information by way of attempting to reproduce magnetic information written in the magnetic recording medium before the magnetic information recording step.

4. The method for judging a coercive force of a magnetic recording medium according to claim 3, further comprising:
an erasing step where, in the case where magnetic information is reproduced from the magnetic recording medium at the checking step, magnetic information is erased with an erasing current of a value sufficient to erase magnetic information of the high coercivity magnetic medium.

5. The method for judging a coercive force of a magnetic recording medium according to claim 3;
wherein the judging step judges that the magnetic recording medium is a low coercivity magnetic medium if the first reproduced output is greater than the second reproduced output, and judges that the magnetic recording medium is a high coercivity magnetic medium if the first reproduced output is less than the second reproduced output.

6. The method for judging a coercive force of a magnetic recording medium according to claim 3;
wherein the judging step further comprises calculating either a difference or a ratio of the first reproduced output and the second reproduced output, in order to obtain the coercive force of the magnetic recording medium.

7. A method for judging a coercive force of a magnetic recording medium, in order for recording magnetic information to be formed in either a low coercivity magnetic medium or a high coercivity magnetic medium by using a magnetic head, the method comprising:
a magnetic information recording step comprising writing magnetic information in the magnetic recording medium by alternately using a first write current sufficient to write magnetic information in a low coercivity magnetic medium, and a second write current sufficient to write magnetic information in a high coercivity magnetic medium;
a magnetic information reproducing step comprising reproducing the magnetic information written in the magnetic recording medium; and
a judging step comprising making a judgment on a coercive force of the magnetic recording medium by way of comparing a first reproduced output of the magnetic information written with the first write current and a second reproduced output of the magnetic information written with the second write current;
wherein the judging step judges that the magnetic recording medium is a low coercivity magnetic medium if the first reproduced output is greater than the second reproduced output, and otherwise judges that the magnetic recording medium is a high coercivity magnetic medium; and
wherein the magnetic information recording step further comprises:
segmenting a magnetic record area, where magnetic information of the magnetic recording medium is recorded, in its longitudinal direction into comparison zones;
wherein the magnetic information is written in the magnetic record area by alternately using the first write current and the second write current with respect to each of the segmented comparison zones.

8. A method for judging a coercive force of a magnetic recording medium, in order for recording magnetic information to be formed in either a low coercivity magnetic medium or a high coercivity magnetic medium by using a magnetic head, the method comprising:
a magnetic information recording step comprising writing magnetic information in the magnetic recording medium by alternately using a first write current sufficient to write magnetic information in a low coercivity magnetic medium, and a second write current sufficient to write magnetic information in a high coercivity magnetic medium;
a magnetic information reproducing step comprising reproducing the magnetic information written in the magnetic recording medium;
a judging step comprising making a judgment on a coercive force of the magnetic recording medium by way of comparing a first reproduced output of the magnetic information written with the first write current and a second reproduced output of the magnetic information written with the second write current;
a checking step comprising checking a presence of magnetic information by way of attempting to reproduce magnetic information written in the magnetic recording medium before the magnetic information recording step;
an erasing step where, in the case where magnetic information is reproduced from the magnetic recording medium at the checking step, magnetic information is erased with an erasing current of a value sufficient to erase magnetic information of the high coercivity magnetic medium; and
wherein the magnetic information recording step further comprises:
segmenting a magnetic record area, where magnetic information of the magnetic recording medium is recorded, in its longitudinal direction comparison zones;
wherein the magnetic information is written in the magnetic record area by alternately using the first write current and the second write current with respect to each of the segmented comparison zones.

* * * * *